(12) United States Patent
Rieger

(10) Patent No.: US 6,276,652 B1
(45) Date of Patent: Aug. 21, 2001

(54) SECURING COMPONENT

(75) Inventor: Mario Rieger, Freiberg (DE)

(73) Assignee: Filterwerk Mann & Hummel GmbH, Ludwigsburg (DE)

( * ) Notice: Subject to any disclaimer, the term of this patent is extended or adjusted under 35 U.S.C. 154(b) by 0 days.

(21) Appl. No.: 09/000,085

(22) PCT Filed: May 15, 1996

(86) PCT No.: PCT/EP96/02089

§ 371 Date: Jan. 26, 1998

§ 102(e) Date: Jan. 26, 1998

(87) PCT Pub. No.: WO97/03801

PCT Pub. Date: Feb. 6, 1997

(30) Foreign Application Priority Data

Jul. 24, 1995 (DE) .............................. 195 26 934

(51) Int. Cl.⁷ .................................................. F16M 13/00
(52) U.S. Cl. .................... 248/560; 248/634; 248/638; 248/635
(58) Field of Search .................................. 248/634, 635, 248/638, 674, 675

(56) References Cited

U.S. PATENT DOCUMENTS

| | | | |
|---|---|---|---|
| 1,876,640 | * 9/1932 | Dobson | 248/635 |
| 3,220,676 | * 11/1965 | Butts | 248/635 |
| 3,261,422 | * 7/1966 | Jensen | 248/634 X |
| 4,139,246 | * 2/1979 | Mikoshiba et al. | 308/26 |
| 4,161,812 | * 7/1979 | Litch, III | 248/638 X |
| 4,713,714 | * 12/1987 | Gatti et al. | 248/638 X |
| 4,749,163 | * 6/1988 | Mestdagh | 248/638 X |
| 4,842,540 | 6/1989 | Endo et al. | |
| 5,153,052 | * 10/1992 | Tanaka et al. | 248/634 X |
| 5,154,823 | 10/1992 | Ma et al. | |
| 5,246,196 | * 9/1993 | Rollett | 248/674 |
| 5,303,896 | * 4/1994 | Sterka | 248/634 X |
| 5,464,197 | * 11/1995 | Linkner, Jr. | 248/635 |
| 5,544,714 | * 8/1996 | May et al. | 180/68.4 |
| 5,829,730 | * 11/1998 | Ott | 248/634 X |

FOREIGN PATENT DOCUMENTS 38 07 797  10/1988 (DE) .
2185063   7/1987 (GB) .

* cited by examiner

Primary Examiner—Ramon O Ramirez
Assistant Examiner—Kimberly Wood
(74) Attorney, Agent, or Firm—Crowell & Moring, L.L.P.

(57) ABSTRACT

A fastening element for a plastic housing, especially a filter housing, which is fitted to a supporting structure so as to damp vibrations. To this end the housing is provided with the fastening element comprising a rubber-elastic member (12), especially a member produced by the two-component injection molding method, and a mounting member of the support structure is lockingly engaged with the fastening element so that the fastening element of the housing is functionally connected to the supporting structure.

6 Claims, 3 Drawing Sheets

SECURING COMPONENT

BACKGROUND OF THE INVENTION

The invention relates to a fastening element for fastening a housing, especially a filter housing, to a supporting structure.

In the state of the art a large number of fastening elements are known. The simplest kind is a screw fastener. This, however, has the disadvantage that additional elements such as a screw and a nut are necessary, and assembly requires considerable effort.

It is also known to mount a housing on a supporting structure with a snap fastener. To this end a pin, for example, is provided on the housing, and is snapped into a corresponding opening in the supporting structure. A disadvantage of this system, however, is the need for close tolerances. Also, several working steps are required in the manufacturing process.

SUMMARY OF THE INVENTION

The object of the invention, therefore, is to provide a fastening element which is simple and inexpensive to manufacture, and which also eliminates the need for close manufacturing tolerances, and offers good acoustical isolation.

This object is achieved by providing a fastening element for securing a plastic housing to a supporting structure, wherein a holding area is provided on the housing, and a rubber-elastic element is formed on said housing in said holding area and is connected to the supporting structure.

The important advantage of the invention is that the fastening element is equipped with a rubber-elastic element, which is made especially by the two-component injection molding method. Such a fastening element can be disposed on the plastic housing in a single procedure during the manufacture of the latter. No subsequent treatment or additional processing are necessary.

According to an advantageous embodiment of the invention, the rubber-elastic element is composed of an elastomer, especially a thermoplastic elastomer (TPE).

TPE can be worked by injection molding and has rubber-elastic properties which can be adapted in their composition to a particular application.

An additional advantageous embodiment provides for configuring the rubber-elastic element so as to achieve great tolerance-compensating effects.

This can be accomplished, for example, in that this element has a kind of pleated structure, or in that parts of the element are configured in the manner of a cradle held at both ends.

One advantageous embodiment envisions the rubber-elastic element being provided with a vibration-damping body structure. Here again the use of TPE has the advantage that this material has high damping qualities and consequently vibrations caused by the supporting structure to which it is fastened are not transmitted to the housing, especially the filter housing. Such vibrations are created, for example, in a motor vehicle. Especially the components of the motor, such as the filter housing and other peripheral elements, must be effectively decoupled from these vibrations. The fastening element is suitable for doing this.

In order to affix the housing to the supporting structure, the fastening element is lockingly engaged with a corresponding counterpart member. This can be, for example, a screw or a pin. Of course, other fastening elements are conceivable, such as straps. For fastening by means of a screw it is desirable to provide in the rubber-elastic element a metal bushing which defines the effective screw length.

An advantageous variant of the invention provides for configuring the fastening element with a plug-in shape in the form of a pin. This pin is inserted into an opening in the supporting structure. Here, too, various shapes can be achieved which display both a tolerance compensating and a vibration damping action.

These and other features of preferred embodiments of the invention are to be found not only in the claims, but also in the description and the drawings; whereby the individual features each can be realized by themselves alone or in subcombinations in the embodiment of the invention, and can be applied to other fields of use and constitute advantageous as well as independently patentable features, for which protection is here claimed.

BRIEF DESCRIPTION OF THE DRAWINGS

The invention will be further explained below with the aid of embodiments. The drawings show.

DETAILED DESCRIPTION OF PREFERRED EMBODIMENTS

Figure 1:
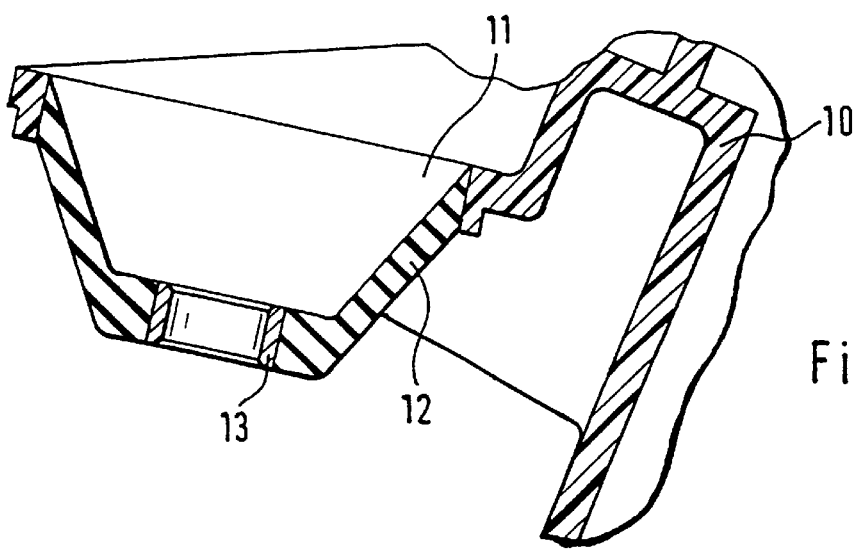
FIG. 1 a section taken through a fastening element made by a two-component technique, FIG. 2 a sectional view of a fastening element having vibration damping properties, FIG. 3 a sectional view of a fastening element with an extended spring flexure for vibration damping, FIG. 4 a sectional and a top view of a fastening element having a simple strap construction.

The sectional view of a fastening element according to FIG. 1 shows a portion of a plastic housing 10 in which a fastening element, i.e., a rubber-elastic element 12, is disposed in an opening 11. This element is manufactured by the two-component injection molding process, i.e., in this process initially the first component, i.e., the plastic housing, is cast, and subsequently a slide is opened in the mold. This slide exposes the cavity for the rubber-elastic element. The composition for making the fastening element is injected into this cavity. After both elements or components have cooled, the complete housing can be removed from the injection mold.

The fastening element 12 is provided with a metal sleeve 13. Of course, such a sleeve is necessary only when it is in working connection with a threaded bolt or the like.

Figure 2:
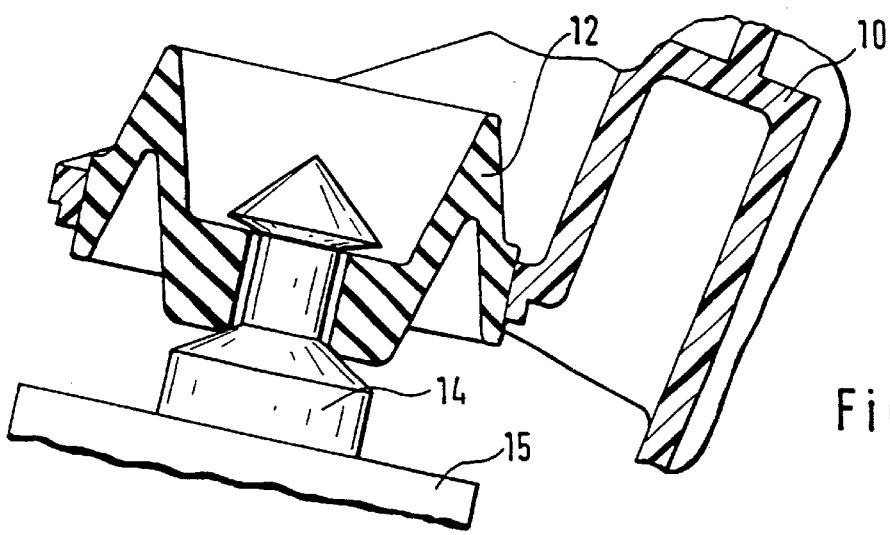

FIG. 2 again shows a portion of the plastic housing 10. The fastening element 12 is disposed thereon by the two-component injection molding technique. It has a shape which is especially suitable for effectively damping vibrations which are transmitted through the fastening pin 14 from the supporting structure 15. Moreover, the design of the fastening element 12 is suitable for compensating positional tolerances between the mounting pin 14 and the plastic housing 10.

Figure 3:
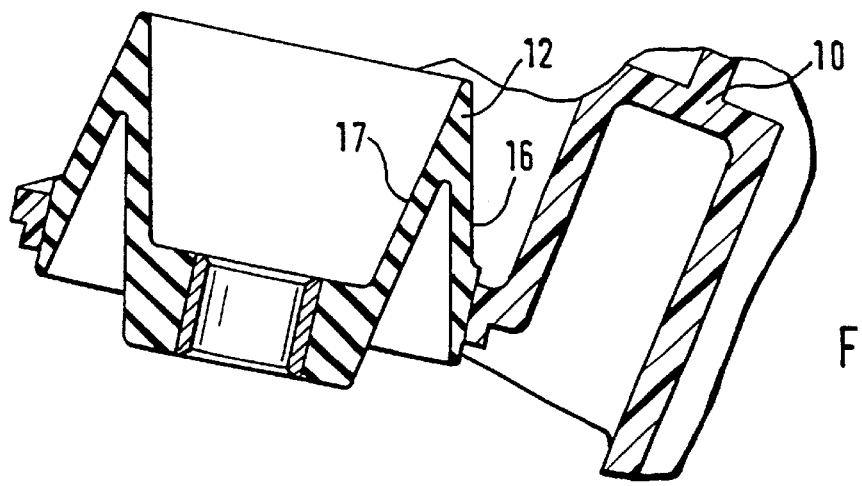

FIG. 3 shows a sectional view of a fastening element with an extended flexural length or softer action. Here again the plastic housing 10 can be seen in part. The fastening element 12 is disposed on it. This fastening element has two long flanks 16 and 17 which, on the one hand, facilitate very great compensation of position, and on the other hand have very good vibration damping properties.

Figure 4:
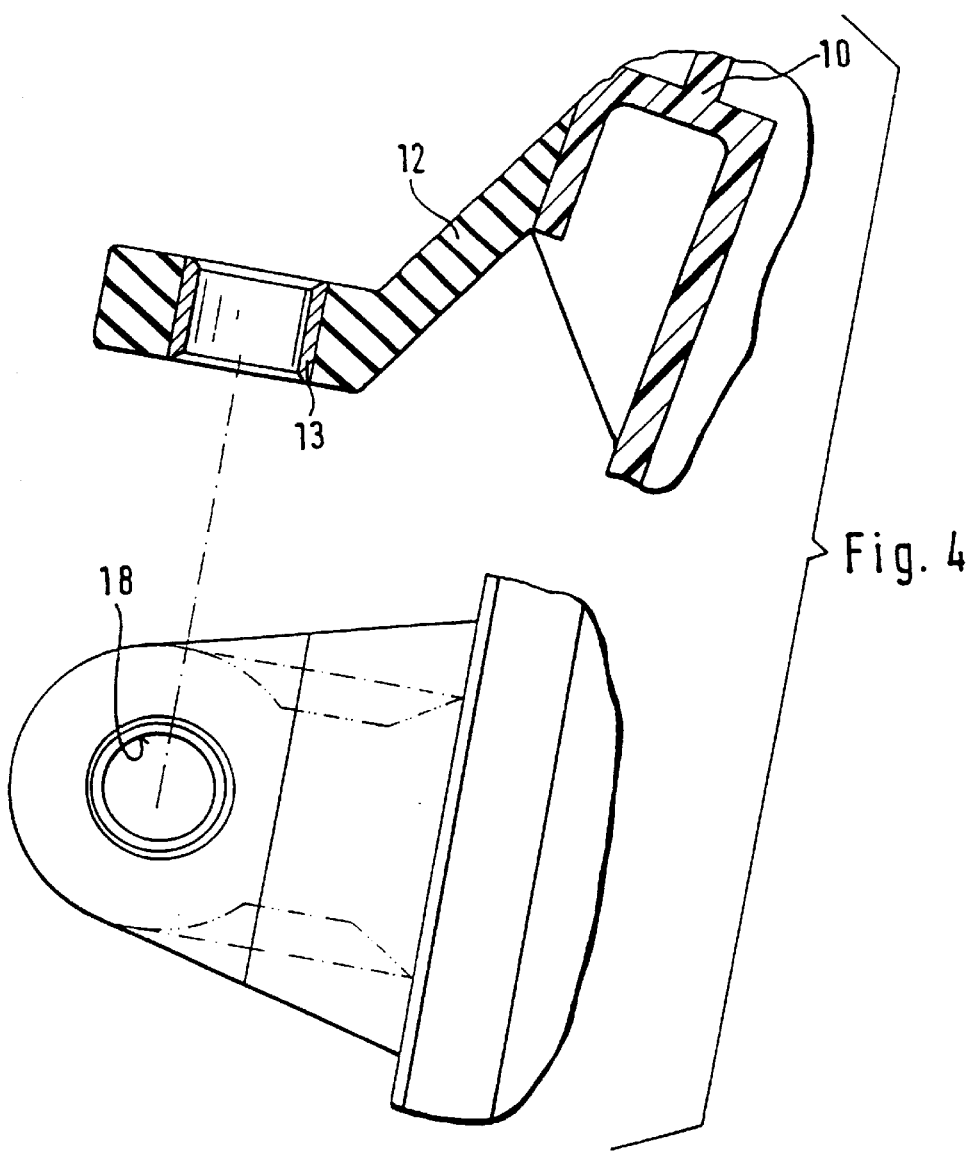

FIG. 4 shows in cross section and in plan view a fastening element of simple strap-like design. The fastening element 12 is injection molded on the plastic housing 10 in the manner of a strap. The plan view shows that this strap has at its front end an eye which is equipped with a bore 18 to accommodate a bolt, not shown here. The connection between the fastening element 12 and the plastic housing can be configured in any desired manner and withstands very large forces.

Figure 5:
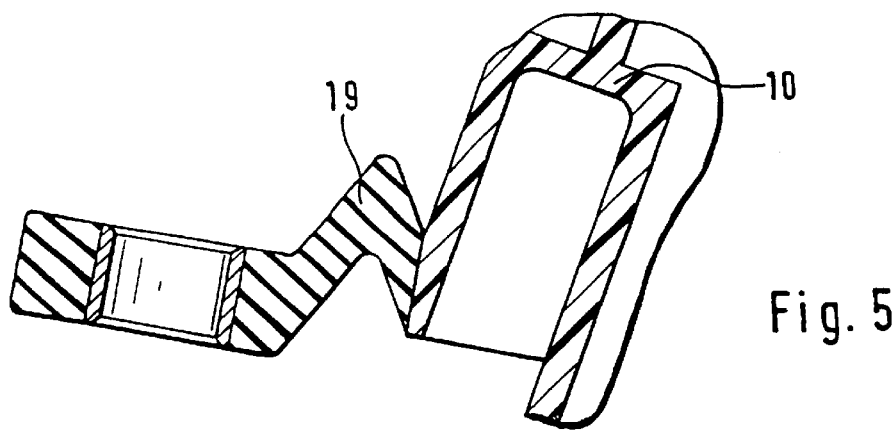
FIG. 5 a sectional view of a simple fastening element having a spring action for vibration damping, FIG. 6 a plug in axial and radial cross section, FIG. 7 a variant embodiment of a plug, FIG. 8 a housing with fastening elements.

In FIG. 5 a fastening element is arranged on the plastic housing 10 which is a simple strap, but also additionally has a bent fastener portion 19. This facilitates better spring action to damp vibrations.

Figure 6:
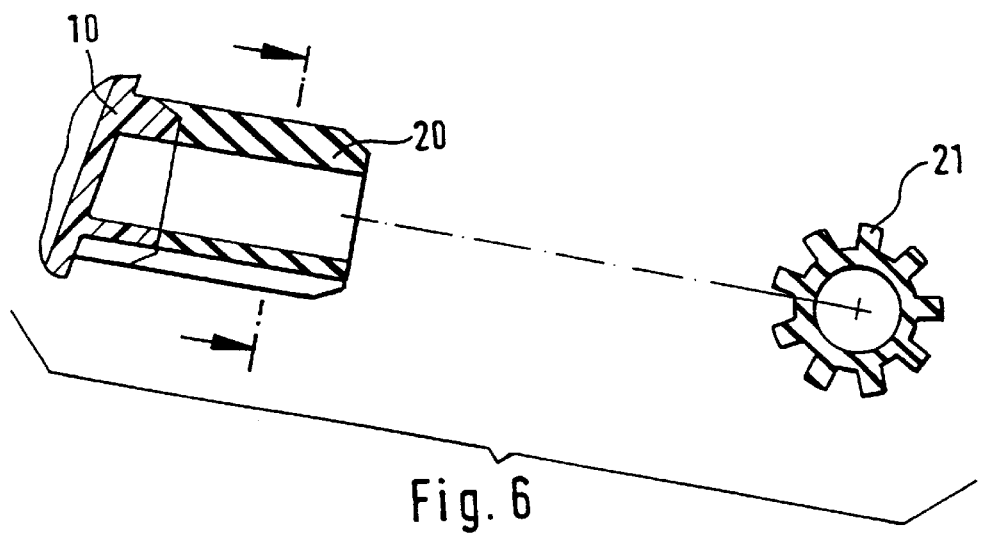

FIG. 6 shows a plug. In the axial section it can be seen that on the plastic housing 10 this plug is configured as a hollow cylindrical element 20. The radial section shows the structure of the hollow cylindrical element. This is provided on its exterior with ribs 21. To fasten the plastic housing 10 to a supporting structure, the element is inserted into a receiving bore.

Figure 7:
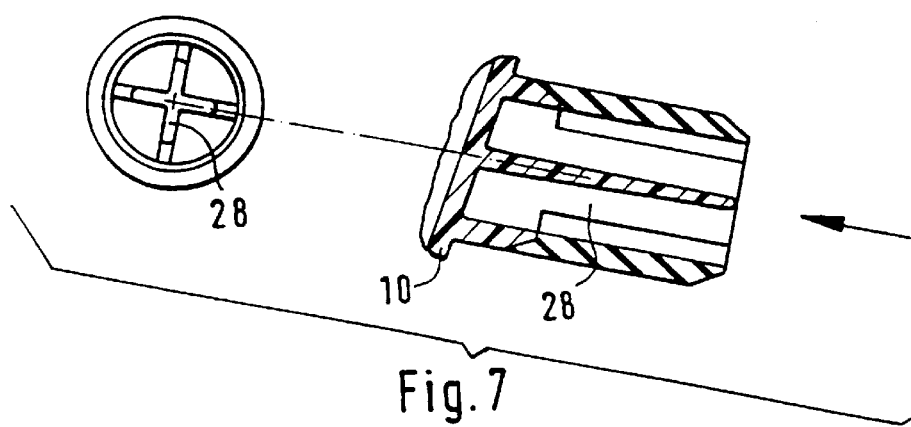

FIG. 7 shows a variant of the this fastening element. While in the axial section its integration with the plastic housing 10 can be seen, the radial section shows that the surface has no ribs. To secure the assembly, a cross rib 28 is provided. This prevents assembly errors, i.e., pinching of the buffer on the housing or on sheet metal is not possible. The cross rib assures that the fastening element also gets into the fastening bore.

Figure 8:
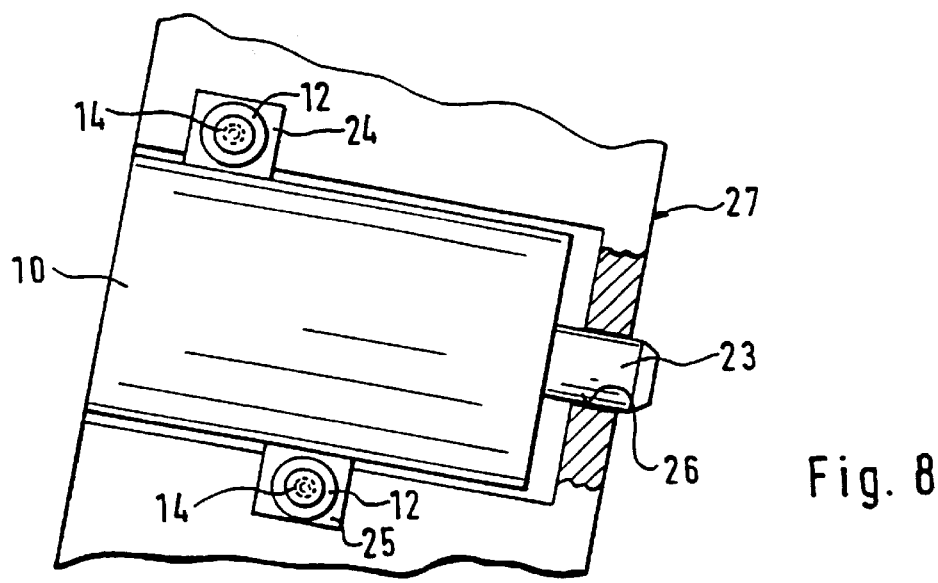

In FIG. 8 the complete structure is shown. A plastic housing 10 is provided with a plug 23 and two fastening straps 24 and 25. By means of the plug 23 the plastic housing is plugged into an opening 26 in the supporting structure 27. Mounting pins are provided on the supporting structure in the area of the fastening straps 24 and 25. The fastening elements 12 integral with the respective fastening straps 24 and 25 are affixed to the mounting pins.

The installation of the plastic housing is thereby very greatly simplified and is performed substantially in a single operation, namely the insertion of the housing by means of the plug and pressing it down onto the fastening pins 14.

What is claimed is:

1. In combination, a plastic housing, a support structure having an aperture, and a fastening structure fastening said plastic housing to said support structure; said fastening structure comprising a rubber-elastic fastening element integrally molded on said plastic housing by a two-component injection molding process; said rubber-elastic fastening element comprising a plug received in the aperture of the support structure, said plug having a tolerance-compensating body structure, and said tolerance compensating body structure comprising radially extending ribs formed exteriorly on said plug.

2. A fastening structure according to claim 1, wherein said housing is an air filter housing for an internal combustion engine of a motor vehicle.

3. A fastening structure according to claim 1, wherein the rubber-elastic element is formed of a thermoplastic elastomer.

4. A fastening structure according to claim 1, wherein said fastening element comprises a plug received in an aperture in the supporting structure, and said tolerance compensating body structure comprises radially extending ribs formed exteriorly on the plug.

5. A fastening structure according to claim 1, wherein the rubber-elastic element has a vibration-damping body structure.

6. A fastening structure according to claim 1, wherein the fastening element has a contour which can be lockingly received in an opening in the supporting structure.

* * * * *